US012684749B2

(12) United States Patent
Katsube et al.

(10) Patent No.: US 12,684,749 B2
(45) Date of Patent: Jul. 14, 2026

(54) ELECTRONIC COMPONENT MODULE

(71) Applicant: Murata Manufacturing Co., Ltd., Kyoto-fu (JP)

(72) Inventors: Akio Katsube, Nagaokakyo (JP); Hideki Shinkai, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 133 days.

(21) Appl. No.: 18/643,036

(22) Filed: Apr. 23, 2024

(65) Prior Publication Data

US 2024/0276691 A1 Aug. 15, 2024

Related U.S. Application Data

(63) Continuation of application No. PCT/JP2022/040144, filed on Oct. 27, 2022.

(30) Foreign Application Priority Data

Nov. 10, 2021 (JP) ................................. 2021-183474

(51) Int. Cl.
*H05K 9/00* (2006.01)

(52) U.S. Cl.
CPC ......... *H05K 9/0084* (2013.01); *H05K 9/0015* (2013.01); *H05K 9/0026* (2013.01); *H05K 9/0029* (2022.08)

(58) Field of Classification Search
CPC ............................ H05K 9/0026; H05K 9/0029
See application file for complete search history.

(56) References Cited

U.S. PATENT DOCUMENTS

| 6,153,315 A | 11/2000 | Yamakoshi et al. |
| 2002/0159242 A1 | 10/2002 | Nakatani et al. |
| 2010/0207264 A1 | 8/2010 | Ono |
| 2012/0187551 A1 | 7/2012 | Kushino et al. |

(Continued)

FOREIGN PATENT DOCUMENTS

| JP | H03-257158 A | 11/1991 |
| JP | H04-332131 A | 11/1992 |

(Continued)

OTHER PUBLICATIONS

International Search Report for PCT/JP2022/040144 dated Jan. 17, 2023.

*Primary Examiner* — Hung V Ngo
(74) *Attorney, Agent, or Firm* — McDonald Hopkins LLC

(57) ABSTRACT

A module includes a substrate, a first component, a sealing resin, and a shield film. The substrate is provided with a first surface. The first component is mounted on the first surface. The first component is sealed with the sealing resin at least from a lateral side. The first component is provided with an exposed surface. The exposed surface is exposed through the sealing resin on a side opposite to the substrate. The shield film is made of metal and covers the first component and the sealing resin. The shield film is provided with a first contact portion. The first contact portion is in contact with the exposed surface. The first contact portion includes a layer formed from a plurality of crystal grains. The plurality of crystal grains are different in longitudinal direction from one another when they are viewed from a direction orthogonal to the first surface.

19 Claims, 12 Drawing Sheets

(56)                    References Cited

U.S. PATENT DOCUMENTS

| 2016/0278202 | A1* | 9/2016 | Nakao | H01L 23/552 |
| 2017/0295643 | A1* | 10/2017 | Suzuki | H01L 23/552 |
| 2017/0311448 | A1* | 10/2017 | Kawabata | H01L 23/552 |
| 2017/0354039 | A1* | 12/2017 | Miwa | H01L 21/561 |
| 2018/0033738 | A1* | 2/2018 | Kawabata | H01L 23/49838 |
| 2018/0110162 | A1* | 4/2018 | Ito | H01L 23/552 |
| 2019/0139902 | A1 | 5/2019 | Lee et al. | |
| 2019/0318973 | A1 | 10/2019 | Okada et al. | |
| 2020/0388553 | A1* | 12/2020 | Nishida | H10W 40/255 |
| 2022/0264748 | A1 | 8/2022 | Okabe et al. | |
| 2023/0200033 | A1* | 6/2023 | Okabe | H01L 23/3135 |
| | | | | 361/816 |

FOREIGN PATENT DOCUMENTS

| JP | H11-001766 | A | 1/1999 |
| JP | 2004-208326 | A | 7/2004 |
| JP | 2010-192653 | A | 9/2010 |
| JP | 2012-151353 | A | 8/2012 |
| JP | 2014-183181 | A | 9/2014 |
| JP | 2018-056393 | A | 4/2018 |
| JP | 2018-064089 | A | 4/2018 |
| JP | 6780710 | B2 | 11/2020 |
| WO | 2021/124806 | A1 | 6/2021 |

* cited by examiner

120(121)

ELECTRONIC COMPONENT MODULE

CROSS REFERENCE TO RELATED APPLICATION

This is a continuation of International Application No. PCT/JP2022/040144 filed on Oct. 27, 2022 which claims priority from Japanese Patent Application No. 2021-183474 filed on Nov. 10, 2021. The contents of these applications are incorporated herein by reference in their entireties.

BACKGROUND OF THE DISCLOSURE

Field of the Disclosure

The present disclosure relates to a module.

Description of the Related Art

Japanese Patent Laid-Open No. 2010-192653 (PTL 1) and Japanese Patent Laid-Open No. 2004-208326 (PTL 2) each disclose a construction of a module.

The module described in PTL 1 includes a first circuit board, a semiconductor component and an electronic component, a molded part, and a coating. The first circuit board is disposed such that an interconnection electrode is exposed at a side end face. The semiconductor component and the electronic component are mounted on the first circuit board. The molded part is composed of resin and covers at least a part of the semiconductor component and the electronic component. A part of the semiconductor component is exposed and the remainder thereof is covered with the molded part. The coating covers the exposed part of the semiconductor component and a surface of the molded part.

The module described in PTL 2 includes an interconnection pattern, a surface acoustic wave element, and a thermosetting resin composition. The surface acoustic wave element is mounted on the interconnection pattern. The surface acoustic wave element is sealed with the thermosetting resin composition. A surface of the surface acoustic wave element opposite to a functional portion thereof and an upper surface of the thermosetting resin composition are flush with each other.

PTL 1: Japanese Patent Laid-Open No. 2010-192653
PTL 2: Japanese Patent Laid-Open No. 2004-208326

BRIEF SUMMARY OF THE DISCLOSURE

In a conventional module, in order to improve performance to radiate heat generated from a component mounted on a substrate, a part of the component is exposed through a sealing resin or a shield film is provided as being in contact with that exposed portion. The portion of the shield film in contact with the component, however, may be deformed; for example, it may separate from the component or may become cracked. In this case, performance of the module to radiate heat through the shield film is lowered.

The present disclosure was made in view of the problem above, and a possible benefit thereof is to provide a module capable of achieving suppression of lowering in heat radiation performance due to deformation of a shield film.

A module based on a first aspect of the present disclosure includes a substrate, a first component, a sealing resin, and a shield film. The substrate is provided with a first surface. The first component is mounted on the first surface. The first component is sealed with the sealing resin at least from a lateral side. The first component is provided with an exposed surface. The exposed surface is exposed through the sealing resin on a side opposite to the substrate. The shield film is made of metal, and covers the first component and the sealing resin. The shield film is provided with a first contact portion. The first contact portion is in contact with the exposed surface. The first contact portion includes a layer formed of a plurality of crystal grains. The plurality of crystal grains are different in longitudinal direction from one another when the plurality of crystal grains are viewed from a direction orthogonal to the first surface.

A module based on a second aspect of the present disclosure includes a substrate, a first component, a sealing resin, and a shield film. The substrate is provided with a first surface. The first component is mounted on the first surface. The first component is sealed with the sealing resin at least from a lateral side. The first component is provided with an exposed surface. The exposed surface is exposed through the sealing resin on a side opposite to the substrate. The shield film is made of metal, and covers the first component and the sealing resin. The shield film is provided with a first contact portion. The first contact portion is in contact with the exposed surface. The exposed surface is roughened.

According to the present disclosure, lowering in heat radiation performance due to deformation of the shield film can be suppressed.

DETAILED DESCRIPTION OF THE DISCLOSURE

Figure 1:
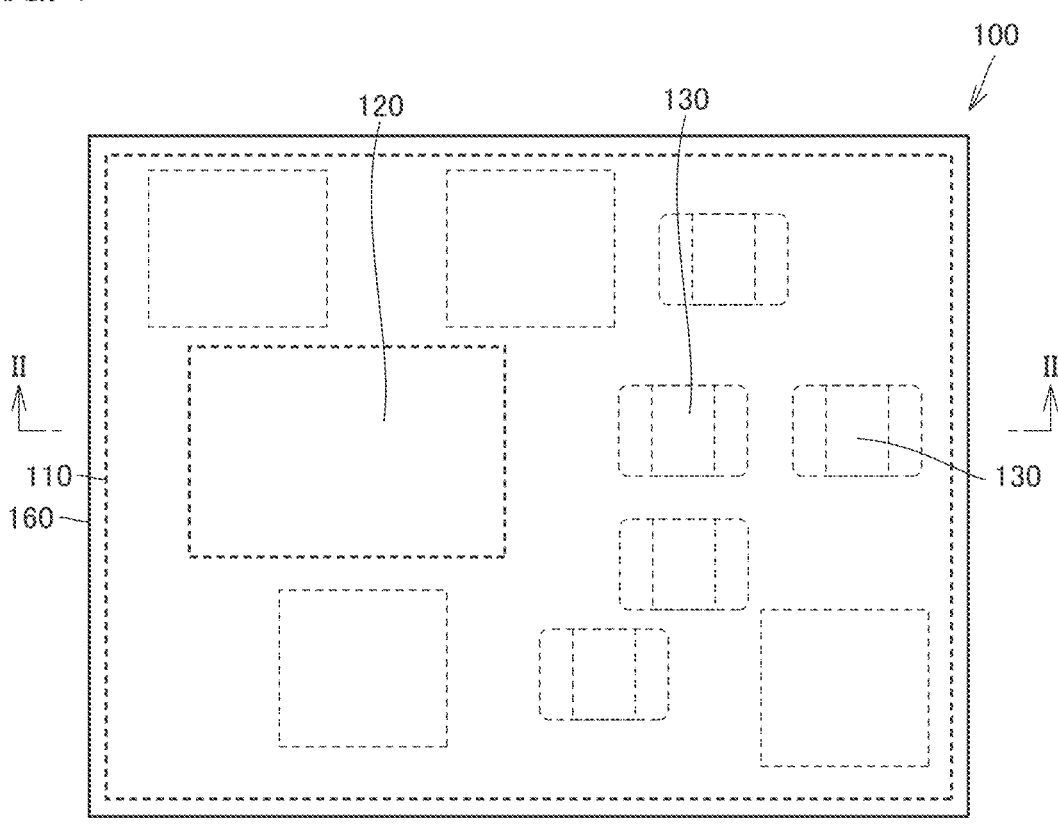
FIG. 1 is a plan view showing a module according to a first embodiment of the present disclosure.

A module according to each embodiment of the present disclosure will be described below with reference to the drawings. In the description of the embodiment below, the same or corresponding elements in the drawings have the same reference characters allotted and description thereof will not be repeated.

First Embodiment

Figure 2:
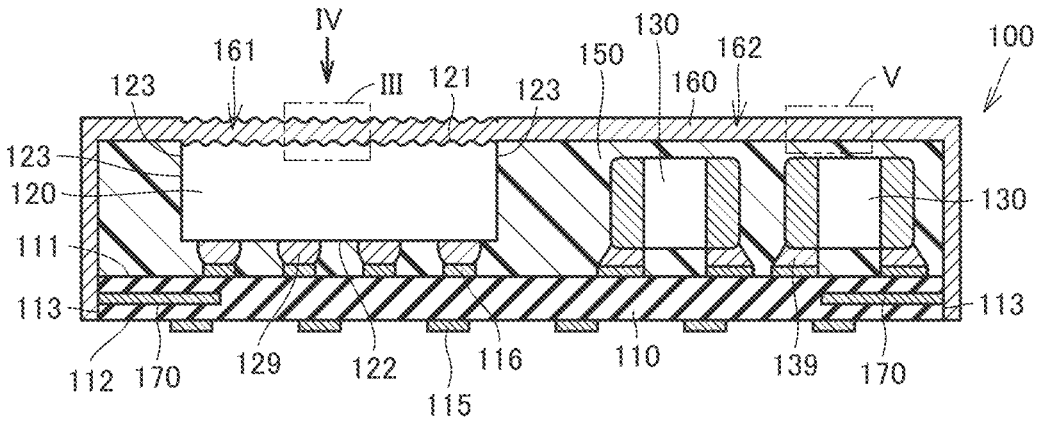
FIG. 2 is a cross-sectional view of the module in FIG. 1, along a direction shown with an arrow II-II.

FIG. 1 is a plan view showing a module according to a first embodiment of the present disclosure. FIG. 2 is a cross-sectional view of the module in FIG. 1, along a direction shown with an arrow II-II. As shown in FIGS. 1 and 2, a module 100 includes a substrate 110, a first component 120, a second component 130, a sealing resin 150, a shield film 160, and an internal electrode 170.

Substrate 110 is specifically a circuit board. Substrate 110 is provided with a first surface 111, a second surface 112, and a side surface 113. Second surface 112 is located opposite to first surface 111. Side surface 113 connects first surface 111 and second surface 112 to each other. Substrate 110 further includes an external terminal 115. External terminal 115 is located on second surface 112. Substrate 110 further includes an internal terminal 116. Internal terminal 116 is located on first surface 111.

First component 120 is mounted on first surface 111 with a solder bump 129 being interposed. First component 120 is specifically an electronic component. Examples of first component 120 include a surface acoustic wave filter, a bulk acoustic wave filter, an integrated circuit (IC) chip, or the like.

First component 120 is provided with an exposed surface 121, a circuit surface 122, and a peripheral side surface 123.

Exposed surface 121 is located opposite to substrate 110. Exposed surface 121 is a roughened surface of the surfaces of first component 120. Therefore, exposed surface 121 is larger in arithmetic mean roughness (Ra) than peripheral side surface 123 of the first component. Arithmetic mean roughness (Ra) of exposed surface 121 is, for example, not less than 0.15 [µm] and not more than 0.95 [µm].

Since exposed surface 121 is roughened, glossiness of exposed surface 121 is relatively low and close to glossiness of a surface of sealing resin 150. Therefore, in an example where a mark such as a two-dimensional code which is readable by a prescribed device and is to be identified based on bright and dark patterns is provided on the surface of sealing resin 150, decrease in difference in brightness between exposed surface 121 and the surface of sealing resin 150 leads to less likeliness of undesired difference in brightness which is a factor for occurrence of an error in reading in the vicinity of the mark. Therefore, a frequency of occurrence of an error in reading can be lowered.

Circuit surface 122 is a surface on a side of first component 120 where an electronic circuit that performs an electrical function as an electronic component is provided, and it is located as being opposed to substrate 110. In other words, circuit surface 122 is located opposite to exposed surface 121. Peripheral side surface 123 connects exposed surface 121 and circuit surface 122 to each other.

A portion in first component 120 that forms exposed surface 121 contains at least one of lithium tantalate (LiTaO$_3$), lithium niobate LiNbO$_3$, quartz (SiO$_2$), Si, and GaAs. When first component 120 is a surface acoustic wave filter, a main material for the portion that forms exposed surface 121 is, for example, lithium tantalate, lithium niobate, or Si. When first component 120 is a bulk acoustic wave filter, a main material for the portion that forms exposed surface 121 is, for example, Si. When first component 120 is an IC, a main material for the portion that forms exposed surface 121 is, for example, Si or GaAs. The main material for first component 120 may be a polycrystalline body or an amorphous body such as glass.

Second component 130 is mounted on first surface 111 with solder 139 being interposed. Second component 130 is specifically an electronic component, and it is, for example, a passive component like a chip such as a capacitor or an inductor. Second component 130 may be a surface acoustic wave filter, a bulk acoustic wave filter, or an IC relatively small in amount of heat generation.

Sealing resin 150 is provided on first surface 111. First component 120 is sealed with sealing resin 150 at least from a lateral side (that is, a side of peripheral side surface 123). Though sealing resin 150 is in contact with the entirety of peripheral side surface 123, it may be in contact only with a part of peripheral side surface 123. Exposed surface 121 of first component 120 is exposed through sealing resin 150 on the side opposite to substrate 110.

Sealing resin 150 contains a resin component and a filler. The resin component is specifically thermosetting resin, and it is, for example, epoxy resin, phenol resin, or a mixture thereof. The filler may be a spherical filler, a filler in an indefinite shape, or a mixture thereof. The filler is specifically composed of an inorganic oxide, and composed, for example, of SiO$_2$ or Al$_2$O$_3$.

Shield film 160 is made of metal and covers first component 120 and sealing resin 150. Shield film 160 extends toward side surface 113 of substrate 110 and is in contact with side surface 113 of substrate 110 while it covers first component 120 and sealing resin 150. Though a total thickness of shield film 160 is not particularly limited, from a point of view of shielding performance and heat radiation performance of shield film 160, it is preferably not smaller than 4 [μm], and from a point of view of a lower profile of module 100, it is preferably not larger than 20 [μm].

Shield film 160 is provided with a first contact portion 161 and a second contact portion 162. First contact portion 161 is in contact with exposed surface 121. Second contact portion 162 is in contact with a portion of sealing resin 150 opposite to substrate 110.

Figure 3:
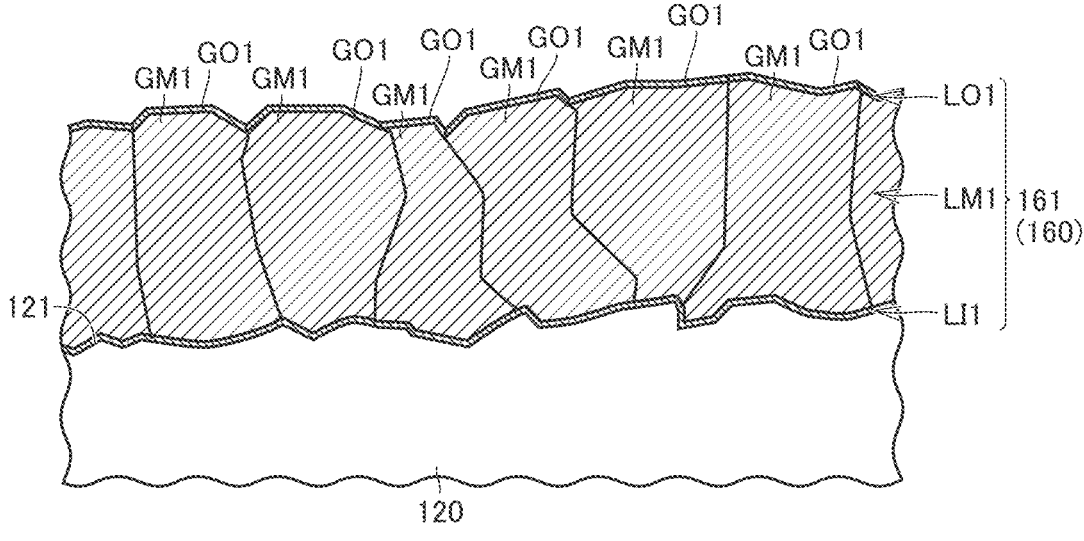
FIG. 3 is a partial cross-sectional view showing a construction in a region III in FIG. 2.

First contact portion 161 will initially be described. FIG. 3 is a partial cross-sectional view showing a construction in a region III in FIG. 2. As shown in FIG. 3, first contact portion 161 includes a layer formed from a plurality of crystal grains. Specifically, first contact portion 161 includes a first inner layer LI1, a first intermediate layer LM1, and a first outer layer LO1. First intermediate layer LM1 is formed from a plurality of crystal grains GM1 and first outer layer LO1 is formed from a plurality of crystal grains GO1. Though first inner layer LI1 is not formed from a plurality of crystal grains in the present embodiment, first inner layer LI1 may also be formed from a plurality of crystal grains. Though first contact portion 161 includes two layers each formed from a plurality of crystal grains, it may include only a single layer or three or more layers as such.

First inner layer LI1 is directly layered on first component 120. First intermediate layer LM1 is layered on first component 120 with first inner layer LI1 being interposed. In first contact portion 161, first intermediate layer LM1 is largest in thickness in a layering direction among layers formed from a plurality of crystal grains. In first contact portion 161, first intermediate layer LM1 is largest in thickness in the layering direction among all layers. First outer layer LO1 is layered on first component 120 with first inner layer LI1 and first intermediate layer LM1 being interposed. First outer layer LO1 is located most distant from first component 120 in first contact portion 161 and exposed to the outside.

Figure 4:
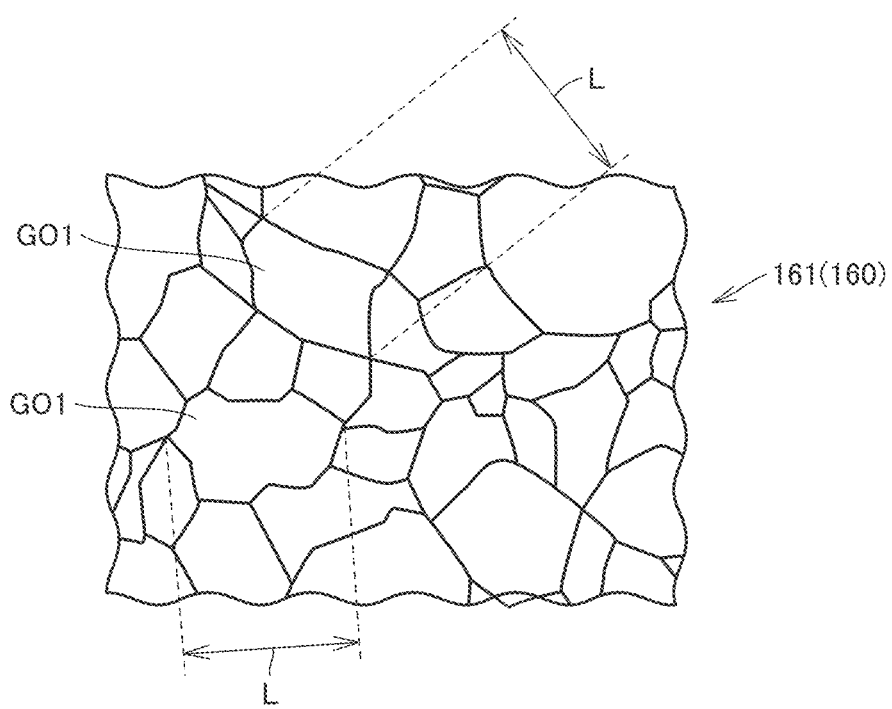
FIG. 4 is a partial plan view when the module in FIG. 2 is viewed from a direction shown with an arrow IV.

FIG. 4 is a partial plan view when the module in FIG. 2 is viewed from a direction shown with an arrow IV. As shown in FIGS. 1 and 4, a plurality of crystal grains that form the layer included in first contact portion 161 of shield film 160 are different in longitudinal direction from one another when they are viewed in the direction orthogonal to first surface 111. Specifically, the plurality of crystal grains GO1 that form first outer layer LO1 are different in longitudinal direction L from one another when they are viewed from the direction orthogonal to first surface 111.

As shown in FIG. 3, when the plurality of crystal grains GO1 that form first outer layer LO1 are viewed from the direction orthogonal to first surface 111, they are located as corresponding to the plurality of crystal grains GM1 that form first intermediate layer LM1 one by one, respectively. Therefore, the plurality of crystal grains GM1 that form first intermediate layer LM1 are also different in longitudinal direction from one another when they are viewed from the direction orthogonal to first surface 111, similarly to crystal grains GO1 shown in FIG. 4.

Figure 5:
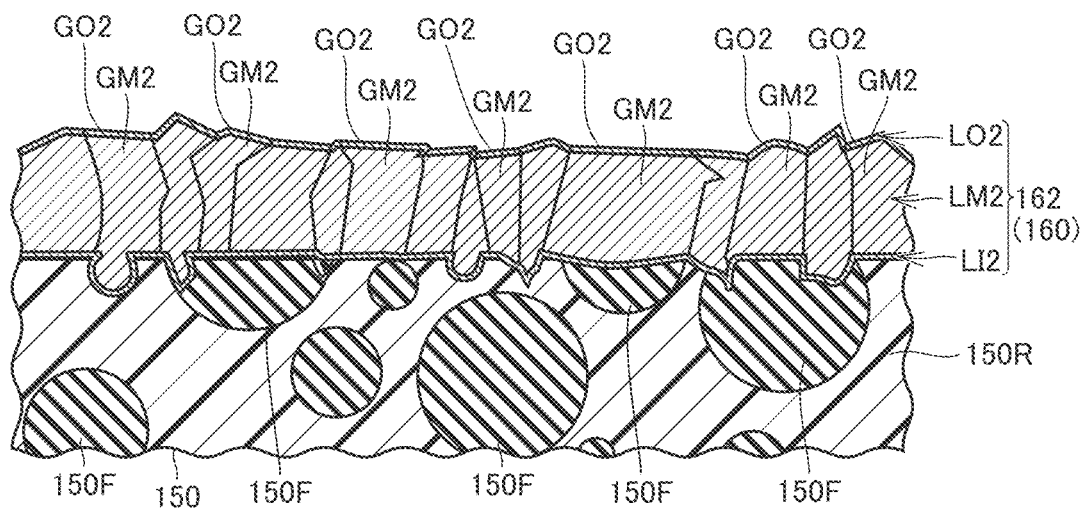
FIG. 5 is a partial cross-sectional view showing a construction in a region V in
FIG. 2.

Second contact portion 162 will now be described. FIG. 5 is a partial cross-sectional view showing a construction in a region V in FIG. 2. As shown in FIG. 5, second contact portion 162 includes a layer formed from a plurality of crystal grains. Specifically, second contact portion 162 includes a second inner layer LI2, a second intermediate layer LM2, and a second outer layer LO2. Second intermediate layer LM2 is formed from a plurality of crystal grains GM2 and second outer layer LO2 is formed from a plurality of crystal grains GO2. Though second inner layer LI2 is not formed from a plurality of crystal grains in the present embodiment, second inner layer LI2 may also be formed from a plurality of crystal grains. Though second contact portion 162 includes two layers each formed from a plurality of crystal grains, it may include only a single layer or three or more layers as such.

Second inner layer LI2 is directly layered on sealing resin 150. Second intermediate layer LM2 is layered on sealing resin 150 with second inner layer LI2 being interposed. In second contact portion 162, second intermediate layer LM2 is largest in thickness in the layering direction among layers formed from a plurality of crystal grains. In second contact portion 162, second intermediate layer LM2 is largest in thickness in the layering direction among all layers. Second outer layer LO2 is layered on sealing resin 150 with second inner layer LI2 and second intermediate layer LM2 being interposed. Second outer layer LO2 is located most distant from sealing resin 150 in second contact portion 162 and exposed to the outside. FIG. 5 schematically shows a resin component 150R and a filler 150F contained in sealing resin 150.

As shown in FIGS. 1, 3, and 5, second contact portion 162 is contiguous to first contact portion 161 in an in-plane direction of first surface 111. Specifically, the layer formed from a plurality of crystal grains in second contact portion 162 is contiguous to the layer formed from a plurality of crystal grains in first contact portion 161 in a plane direction orthogonal to the layering direction. Specifically, in the plane direction orthogonal to the layering direction, second intermediate layer LM2 is contiguous to first intermediate layer LM1 and second outer layer LO2 is contiguous to first outer layer LO1. In the plane direction, second inner layer LI2 is also contiguous to first inner layer LI1.

When the plurality of crystal grains that form the layer included in second contact portion 162 of shield film 160 are viewed from the direction orthogonal to first surface 111, they are different in longitudinal direction from one another. Specifically, when the plurality of crystal grains GO2 that form second outer layer LO2 are viewed from the direction orthogonal to first surface 111, they are different in longitudinal direction from one another similarly to the plurality of crystal grains GO1 shown in FIG. 4. When the plurality of crystal grains GM2 that form second intermediate layer LM2 are viewed from the direction orthogonal to first surface 111, they are different in longitudinal direction from one another.

The longitudinal direction of each crystal grain described above when viewed from the direction orthogonal to first surface 111 can be calculated by visually checking image data obtained with a magnification of a scanning electron microscope (SEM) being set, for example, to 5000× or by having a computer read and analyze the image data. A longitudinal length of each of the plurality of crystal grains is, for example, not smaller than 100 [nm] and not larger than 100 [μm]. When the longitudinal length is equal to or smaller than 100 [μm], a size of the crystal grain is sufficiently small. Since magnitude of force with which shield film 160 is going to separate from first component 120 or sealing resin 150 is in proportion to the size of the crystal grain, the sufficiently small size of the crystal grain leads to weaker force with which shield film 160 is going to separate from first component 120 or sealing resin 150. Therefore, deformation due to separation of shield film 160 is further suppressed.

Shield film 160, that is, each of first inner layer LI1, first intermediate layer LM1, first outer layer LO1, second inner layer LI2, second intermediate layer LM2, and second outer layer LO2, should only contain at least one element selected from among Ti, Cr, Co, Ni, Fe, Cu, Ag, and Au or an alloy containing such an element. Specifically, shield film 160 contains Cu and stainless steel. First inner layer LI1, first outer layer LO1, second inner layer LI2, and second outer layer LO2 are made of stainless steel. First intermediate layer LM1 and second intermediate layer LM2 contain Cu as the main material.

As shown in FIG. 2, internal electrode 170 is located in the inside of substrate 110, exposed at side surface 113 of substrate 110, and in contact with shield film 160. Internal electrode 170 is a ground electrode.

Figure 6:
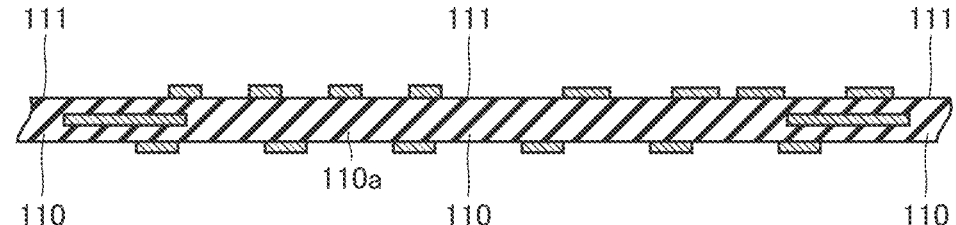
FIG. 6 is a cross-sectional view showing a state in which a substrate assembly is prepared in a method of manufacturing the module according to the first embodiment of the present disclosure.

A method of manufacturing module 100 according to the first embodiment of the present disclosure will be described below. FIG. 6 is a cross-sectional view showing a state in which a substrate assembly is prepared in the method of manufacturing the module according to the first embodiment of the present disclosure. As shown in FIG. 6, a substrate assembly 110a is an assembly of substrates 110 included in respective modules 100. Substrate assembly 110a is an assembly of a plurality of substrates 110 connected to one another such that first surfaces 111 of the plurality of substrates 110 are contiguous to one another.

Figure 7:
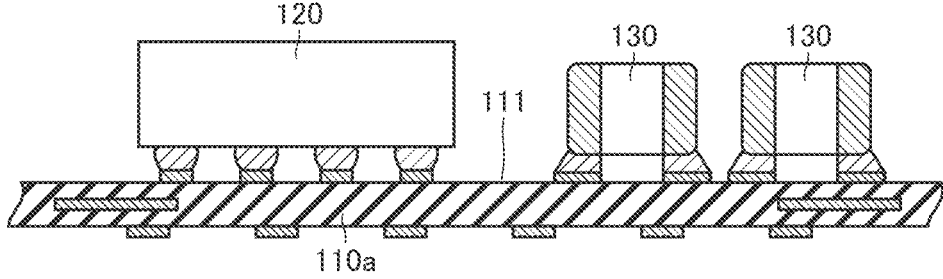
FIG. 7 is a cross-sectional view showing a state in which a first component and the like are mounted on the substrate assembly in the method of manufacturing the module according to the first embodiment of the present disclosure.

FIG. 7 is a cross-sectional view showing a state in which the first component and the like are mounted on the substrate assembly in the method of manufacturing the module according to the first embodiment of the present disclosure. As shown in FIG. 7, such components as first component 120 and second component 130 are mounted on first surface 111 of substrate assembly 110a. These components are mounted on first surface 111, for example, by printing a solder paste on first surface 111 and thereafter performing reflow soldering with the use of this solder paste. After these components are mounted on first surface 111, flux cleaning is performed.

Figure 8:
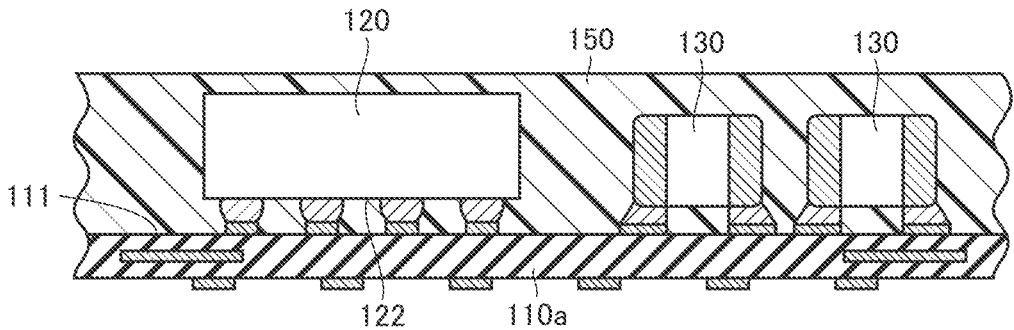
FIG. 8 is a cross-sectional view showing a state in which a sealing resin is arranged on a first surface of the substrate assembly in the method of manufacturing the module according to the first embodiment of the present disclosure.

FIG. 8 is a cross-sectional view showing a state in which the sealing resin is arranged on the first surface of the substrate assembly in the method of manufacturing the module according to the first embodiment of the present disclosure. As shown in FIG. 8, sealing resin 150 yet to be cured is provided on first surface 111 of substrate assembly 110a by molding. At this time, first component 120 and second component 130 mounted on first surface 111 are sealed with sealing resin 150 to completely be covered therewith. Thereafter, sealing resin 150 is cured by heating substrate assembly 110a provided with sealing resin 150 yet to be cured in an oven or the like. In molding sealing resin 150 yet to be cured, the filler is added to the resin component and they are kneaded in advance.

Figure 9:
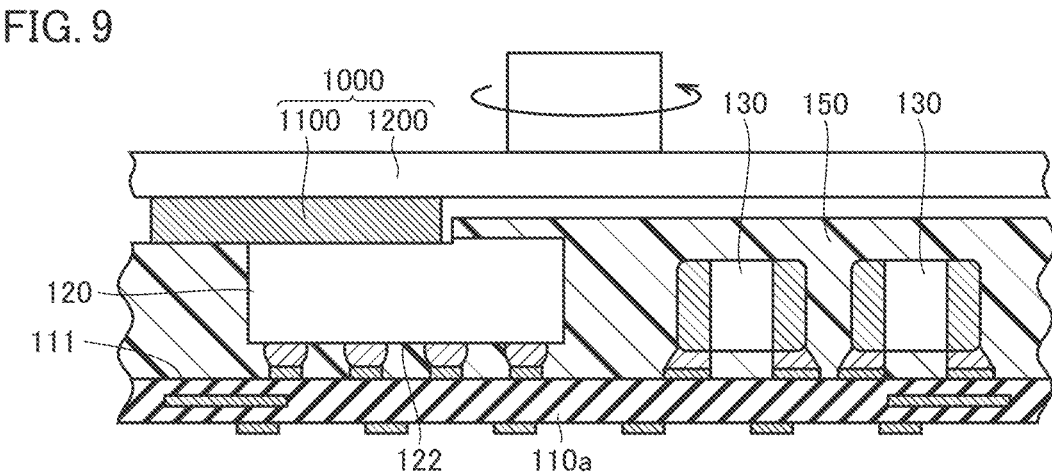
FIG. 9 is a cross-sectional view showing a state in which the sealing resin and the first component are being ground in the method of manufacturing the module according to the first embodiment of the present disclosure.
Figure 10:
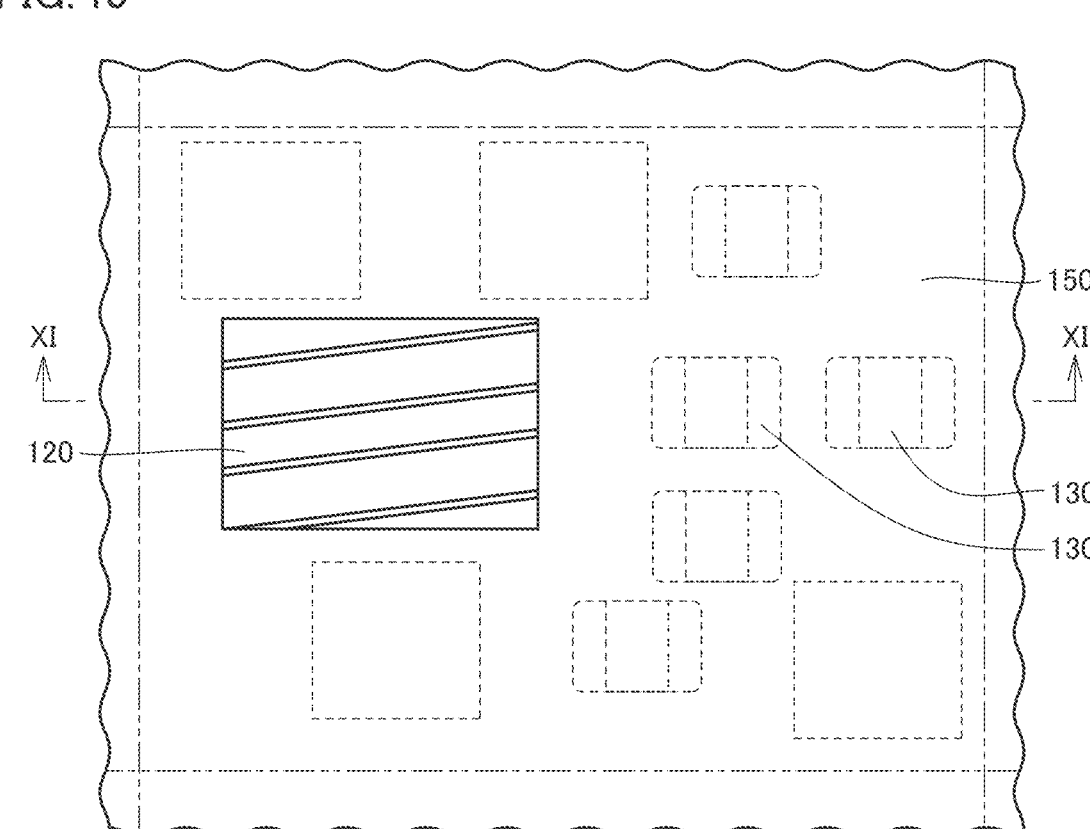
FIG. 10 is a plan view showing a construction in a state in which the sealing resin and the first component have been ground in the method of manufacturing the module according to the first embodiment of the present disclosure.
Figure 11:
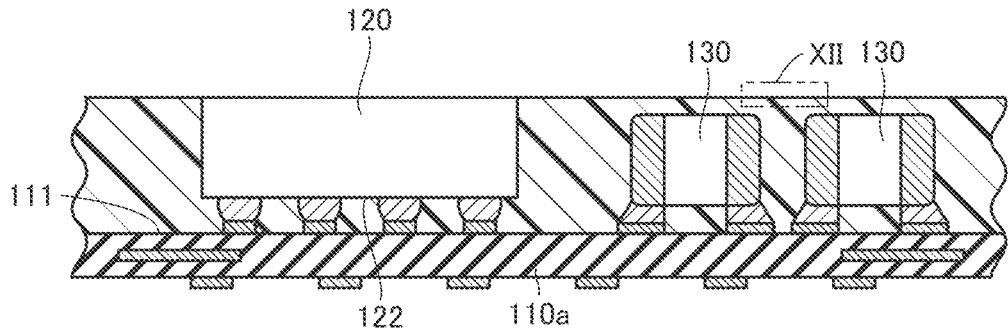
FIG. 11 is a cross-sectional view of a construction in a state after a grinding step shown in FIG. 10 when viewed from a direction shown with an arrow XI-XI.

FIG. 9 is a cross-sectional view showing a state in which the sealing resin and the first component are being ground in the method of manufacturing the module according to the first embodiment of the present disclosure. FIG. 10 is a plan view showing a construction in a state in which the sealing resin and the first component have been ground in the method of manufacturing the module according to the first embodiment of the present disclosure. FIG. 11 is a cross-sectional view of a construction in a state after a grinding step shown in FIG. 10 when viewed from a direction shown with an arrow XI-XI. As shown in FIGS. 9 to 11, a portion of sealing resin 150 in a state in FIG. 8 which is located opposite to first surface 111 is ground by a grinding machine 1000. At this time, a portion of first component 120 on the side opposite to circuit surface 122 is also ground together with sealing resin 150.

Sealing resin 150 and first component 120 are ground such that second component 130 is not exposed through sealing resin 150. Therefore, in an example where a maximum height of second component 130 is, for example, 300 [μm] in the direction orthogonal to first surface 111, a height of first component 120 yet to be ground should be set to 400 [μm], a height of sealing resin 150 yet to be ground should be set to 500 [μm], and the heights of ground first component 120 and ground sealing resin 150 should be set to 350 [μm].

Though grinding machine 1000 used in the grinding step described above is not particularly limited, it is, for example, a rotary grinding machine. More specifically, first component 120 and sealing resin 150 are ground by creep feed grinding or in-feed grinding with the use of a circular wheel 1200 provided with a grinding wheel 1100. A grinding wheel obtained by solidifying hard particles such as diamond particles with a binder such as resin is employed as the grinding wheel.

Since an axial direction of wheel 1200 is perpendicular to the plane direction of first surface 111 and a diameter of wheel 1200 is sufficiently larger than a size of module 100, grinding wheel 1100 moves substantially linearly along the plane direction of first surface 111. Therefore, a plurality of linear grinding flaws substantially in parallel to one another are provided in the surface of first component 120 (that is, the surface opposite to circuit surface 122) along a direction of rotation of wheel 1200 provided with grinding wheel 1100.

Figure 12:
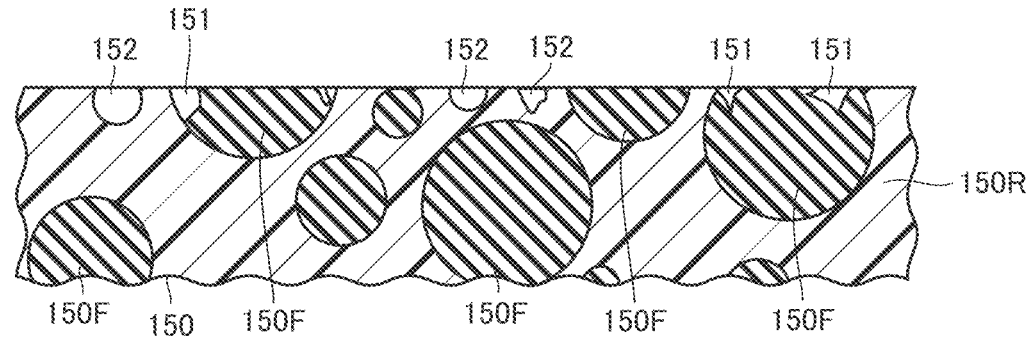
FIG. 12 is a partial cross-sectional view showing a construction in a region XII in FIG. 11.

Creep feed grinding or in-feed grinding affects also a surface profile of sealing resin 150. FIG. 12 is a partial cross-sectional view showing a construction in a region XII in FIG. 11. As shown in FIG. 12, in grinding sealing resin 150, due to a load applied by grinding, a part of filler 150F is chipped and a chipped portion 151 is caused in the vicinity of the surface of sealing resin 150. This chipped portion 151 is likely at an interface between resin component 150R and filler 150F. As a particle of filler 150F exposed at the surface of sealing resin 150 comes off, a depression 152 is also provided. Depression 152 is, for example, hemispherical. Furthermore, resin ground away by grinding is pressed into chipped portion 151 and depression 152 and the resin is drawn. Many wrinkles are thus also produced in the surface of sealing resin 150 opposite to first surface 111, and consequently fine projections and recesses are randomly provided.

Figure 13:
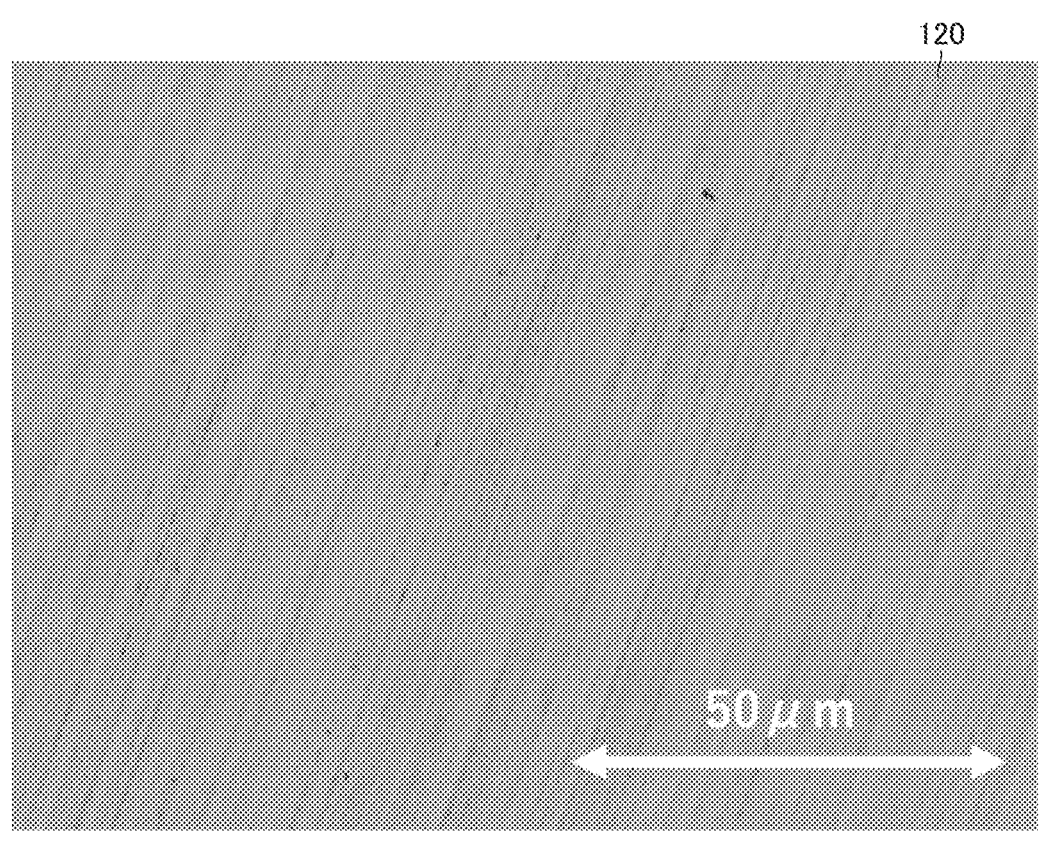
FIG. 13 shows an optical microscope image showing an exemplary surface of the first component immediately after the grinding step in the method of manufacturing the module according to the first embodiment of the present disclosure.

FIG. 13 shows an optical microscope image showing an exemplary surface of the first component immediately after the grinding step in the method of manufacturing the module according to the first embodiment of the present disclosure. As shown in FIG. 13, a plurality of linear grinding flaws substantially in parallel to one another are provided in the surface of first component 120 immediately after the grinding step.

Figure 14:
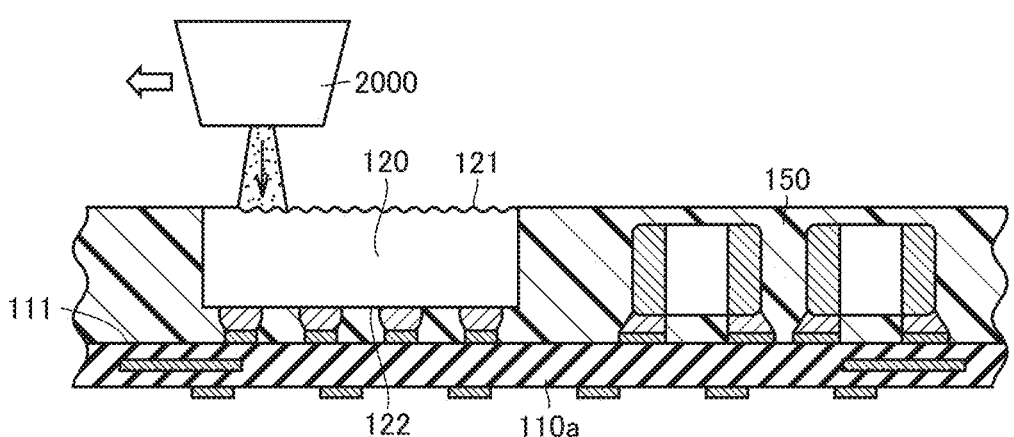
FIG. 14 is a cross-sectional view showing a roughening step following the grinding step in the method of manufacturing the module according to the first embodiment of the present disclosure.

FIG. 14 is a cross-sectional view showing a roughening step following the grinding step in the method of manufacturing the module according to the first embodiment of the present disclosure. As shown in FIG. 14, in the roughening step, an injection nozzle 2000 is used to inject blast particles by wet blasting to a portion of ground first component 120 opposite to circuit surface 122. Roughened exposed surface 121 of first component 120 is thus formed. In exposed surface 121, the linear grinding flaws in the surface of first component 120 caused in creep feed grinding or in-feed grinding disappear, and instead, fine projections and recesses caused by blast marks in conformity with geometries of blast particles that impinged on the surface of first component 120 are randomly provided. The surface of sealing resin 150 may be roughened together with first component 120 by wet blasting.

Examples of slurry to be injected in wet blasting include a mixture obtained by mixing alumina ($Al_2O_3$) abrasive grains in water. For example, precision polishing microgrits having a grain size of #600 (having an average particle size of approximately 20 [μm]) and defined under JIS standard (JIS6001-2 (2017)) can be employed as alumina abrasive grains, and a concentration of alumina in the slurry is not lower than 10 [wt %] and not higher than 20 [wt %]. The slurry is injected as being mixed with compressed air at a pressure not lower than 0.1 [MPa] and not higher than 0.4 [MPa]. Surface roughness (arithmetic mean roughness (Ra)) of exposed surface 121 can be controlled by controlling a pressure of compressed air and a time period for injection at each portion of injection. Surface roughness (arithmetic mean roughness (Ra)) of exposed surface 121 can be made larger, for example, by increasing the pressure of compressed air or the time period for injection. The time period for injection is controlled by adjusting a time period for movement at each portion of injection while injection nozzle 2000 is moved in parallel to first surface 111 or adjusting the number of times of injection at each portion of injection.

In the roughening step, instead of wet blasting, dry blasting in which alumina powders are injected over compressed air directly toward first component 120 (and sealing resin 150) may be performed. Even when dry blasting is performed, random fine projections and recesses are provided in exposed surface 121 of first component 120. After the roughening step, a cleaning step may be performed. In an example where the main material for first component 120 is a polycrystalline body or an amorphous body such as glass, first component 120 may be treated by chemical etching instead of wet blasting. In particular, when the main material for first component 120 is the polycrystalline body, crystal grains different in geometry are randomly present in first component 120 and crystal grain boundaries tend to be etched. Therefore, as a result of etching, randomly present crystal grains remain as projecting on the surface, and random fine projections and recesses are provided in exposed surface 121 of first component 120.

Instead of the grinding step by creep feed grinding or in-feed grinding and the roughening step, first component 120 and sealing resin 150 may be ground by a surface grinding method. In the surface grinding method, a disc grindstone having a central axis extending in a direction in parallel to first surface 111 rotates so that a rotating surface of the grindstone comes in contact with first component 120 and sealing resin 150. First component 120 and sealing resin 150 are thus ground. In this case, each of a plurality of particles (for example, diamond particles) provided at the surface of the grindstone individually comes in contact with first component 120 only instantaneously. Therefore, a distance by which the particle grinds the first component per one contact is very short. Thus, a linear and continuous flaw is not provided in first component 120, but exposed surface 121 provided with random fine projections and recesses and roughened can be formed.

Instead of the grinding step by creep feed grinding or in-feed grinding and the roughening step, the surface of first component 120 may be irradiated with randomly swept laser pulses. Roughened exposed surface 121 can thus be formed. In this case, desirably, the main material for first component 120 on a side of exposed surface 121 does not allow passage of laser beams therethrough. For example, when the main material for first component 120 on the side of exposed surface 121 is Si, preferably, laser pulses are, for example, pulsed waves such as harmonics of YAG laser having a wavelength not longer than 1 μm.

Figure 15:
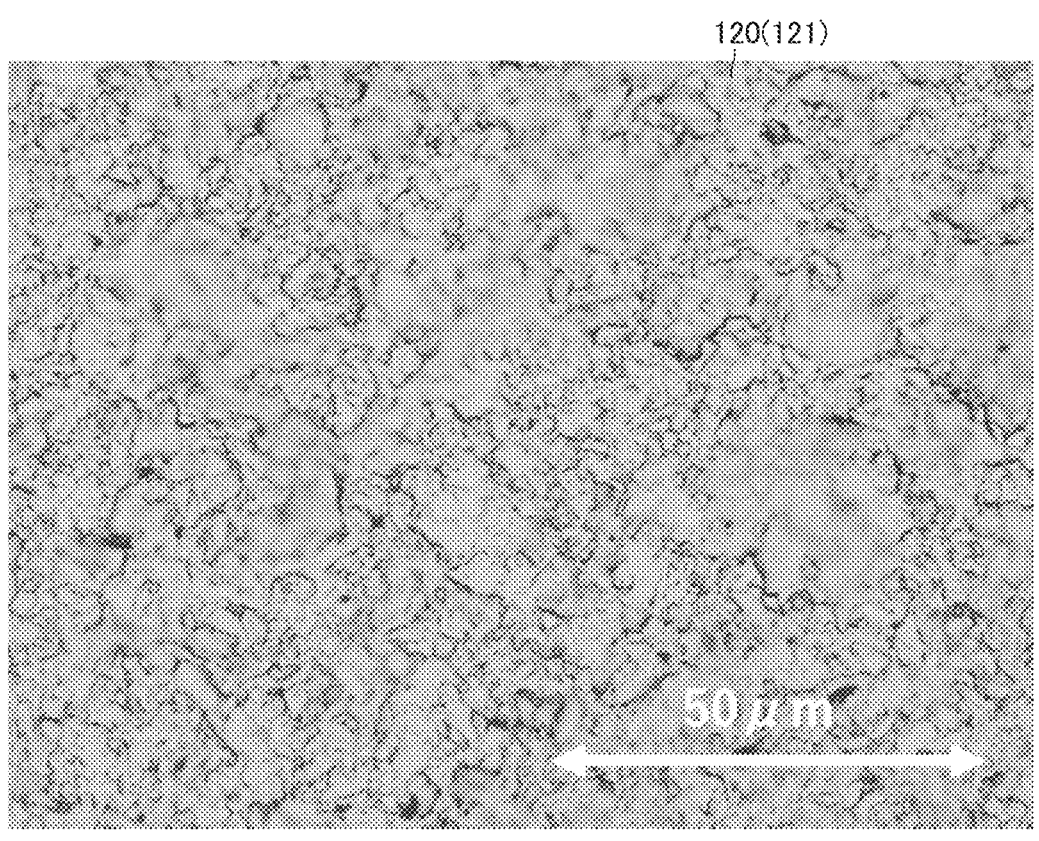
FIG. 15 shows an optical microscope image showing an exemplary surface of the first component immediately after the roughening step in the method of manufacturing the module according to the first embodiment of the present disclosure.

FIG. 15 shows an optical microscope image showing an exemplary surface of the first component immediately after the roughening step in the method of manufacturing the module according to the first embodiment of the present disclosure. As shown in FIG. 15, in the surface (that is, exposed surface 121) of first component 120 immediately after wet blasting, while blast marks (depressions) caused by the blast particles (alumina abrasive grains in the example above) are superimposed on one another, these blast marks are randomly distributed. Since the blast particles are different from one another in geometry and size, geometries of the blast marks themselves are also different from one another. As first component 120 is thus roughened, fine random projections and recesses are provided in exposed surface 121. Few linear grinding flaws remain in exposed surface 121, although the linear grinding flaws existed immediately after the grinding step.

Figure 16:
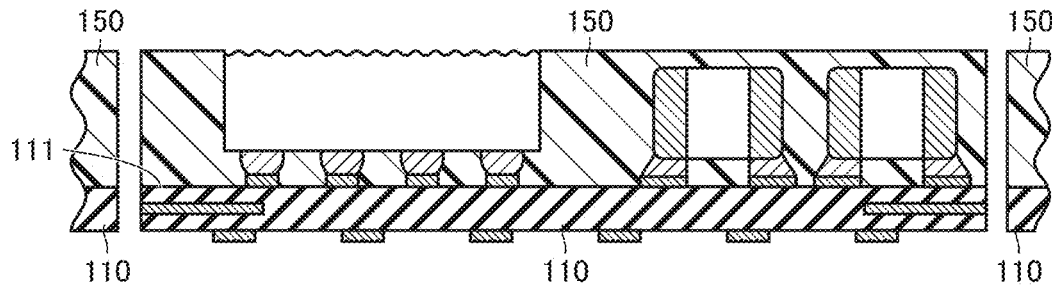
FIG. 16 is a cross-sectional view showing a state in which the substrate assembly is being diced in the method of manufacturing the module according to the first embodiment of the present disclosure.

FIG. 16 is a cross-sectional view showing a state in which the substrate assembly is being diced in the method of manufacturing the module according to the first embodiment of the present disclosure. As shown in FIG. 16, substrate assembly 110a is diced into a plurality of substrates 110 as necessary by cutting with a dicer or the like. Accordingly, sealing resin 150 is also simultaneously cut and diced such that pieces of sealing resin 150 correspond to the plurality of substrates 110, respectively.

As shown in FIGS. 1 and 2, shield film 160 is then formed on first component 120, sealing resin 150, and side surface 113 of substrate 110 by sputtering of metallic atoms to manufacture module 100.

At this time, as shown in FIGS. 3 to 5, the random projections and recesses in exposed surface 121 of first component 120 and the surface of sealing resin 150 bring about a difference in rate of growth of a plurality of metallic crystal grains. Therefore, the plurality of crystal grains that form the layer included in first contact portion 161 and second contact portion 162 are formed as being different in longitudinal direction from one another when they are viewed from the direction orthogonal to first surface 111. The thickness of shield film 160 is adjusted based on a sputtering condition.

Since first inner layer LI1 and second inner layer LI2 are formed to be very smaller in thickness than first intermediate layer LM1 and second intermediate layer LM2 in the present embodiment, there is no crystal grain boundary therein. First inner layer LI1 and second inner layer LI2, however, are formed in conformity with the projections and recesses very small in thickness. First intermediate layer LM1 and second intermediate layer LM2 are thus affected by the projections and recesses, and they are formed such that the plurality of crystal grains GM1 are different in longitudinal direction from one another and the plurality of crystal grains GM2 are different in longitudinal direction from one another when they are viewed from the direction orthogonal to first surface 111. Metallic particles in first outer layer LO1 and second outer layer LO2 grow to be in conformity with crystal grains GM1 in first intermediate layer LM1 and crystal grains GM2 in second intermediate layer LM2, respectively. Therefore, the plurality of crystal grains GO1 are formed as being different in longitudinal direction from one another and the plurality of crystal grains GO2 are formed as being different in longitudinal direction from one another when they are viewed from the direction orthogonal to first surface 111. Consequently, crystal grains are formed such that the size of each crystal grain when viewed from the direction orthogonal to first surface 111 is smaller, and hence force with which shield film 160 is going to separate from first component 120 becomes weaker.

After surface treatment by wet blasting, as arithmetic mean roughness (Ra) of exposed surface 121 is larger, randomness of the longitudinal directions of the crystal grains in shield film 160 is also larger, and hence the crystal grains are relatively small in size. Therefore, force with which shield film 160 is going to separate from first component 120 also becomes further weaker.

A module according to a comparative example which is manufactured by forming a metallic shield film on the first component without the roughening step following the grinding step by creep feed grinding or in-feed grinding will be described.

Figure 17:
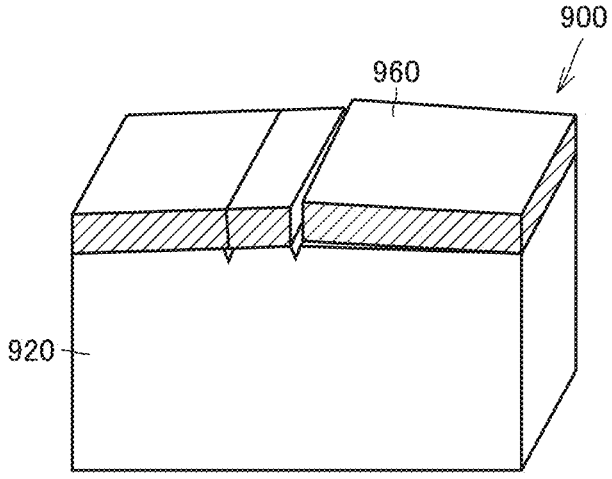
FIG. 17 is a schematic perspective cross-sectional view partially showing a module according to a comparative example.

FIG. 17 is a schematic perspective cross-sectional view partially showing the module according to the comparative example. As shown in FIG. 17, in a module 900 according to the comparative example, a plurality of crystal grains in a shield film 960 on a first component 920 are identical to one another in longitudinal direction when they are viewed from the direction orthogonal to the first surface of the substrate. This is because, in the comparative example, crystal grain boundaries are formed along grinding flaws in first component 920 caused by creep feed grinding or in-feed grinding.

Since such a plurality of crystal grains each have a very long longitudinal length, force with which shield film 960 is going to separate from first component 920 becomes stronger. If a part of shield film 960 separates from first component 920, shield film 960 is split in the in-plane direction. Therefore, heat transferability in the in-plane direction of shield film 960 is lowered and heat radiation performance of module 900 is relatively lowered. In picking up module 900 to mount the same on a mother board, a part of shield film 960 may come off by force applied by the pick-up nozzle. Shield film 960 that comes off may be introduced between an electrode of module 900 and an electrode of the mother board and such a failure as short-circuiting may also occur.

On the other hand, as shown in FIGS. 1 to 5, in module 100 according to the first embodiment of the present disclosure, first contact portion 161 is in contact with exposed surface 121 of first component 120 and includes the layer formed from a plurality of crystal grains. The plurality of crystal grains are different in longitudinal direction from one another when they are viewed from the direction orthogonal to first surface 111. Since the size of the crystal grains is relatively small, such deformation as separation of first contact portion 161 in shield film 160 from first component 120 or crack of the first contact portion is suppressed, and lowering in heat transferability in a direction intersecting with the direction of thickness is suppressed. In other words, lowering in heat radiation performance due to deformation of shield film 160 can be suppressed.

Furthermore, for example, even when a surface acoustic wave filter, a bulk acoustic wave filter, or an IC of a power amplifier type which receives input of a great current which is a cause of increase in amount of heat generation is employed as first component 120, an amount of heat transfer from first component 120 to another component mounted on module 100 is relatively suppressed because heat radiation performance of first component 120 is improved. Therefore, a plurality of components including first component 120 can be mounted on module 100 in high density. Accordingly, module 100 can be reduced in size, and can suitably be mounted on a small device such as a smartphone for which miniaturization of internal wiring or integration of internal components is required in the field of wireless communication.

In module 100 according to the first embodiment of the present disclosure, first contact portion 161 is in contact with roughened exposed surface 121. Thus, when first contact portion 161 is formed on exposed surface 121, crystal grains in shield film 160 grow to be in conformity with a plurality of small respective depressions provided in exposed surface 121 by roughening. Therefore, the size of the crystal grains in shield film 160 can readily be made smaller. Accordingly, such deformation as separation of first contact portion 161 from first component 120 or crack of the first contact portion is suppressed and lowering in heat transferability in the direction intersecting with the direction of thickness is suppressed. In other words, lowering in heat radiation performance due to deformation of shield film 160 can be suppressed.

In module 100 according to the first embodiment of the present disclosure, arithmetic mean roughness (Ra) of exposed surface 121 is not less than 0.15 μm and not more than 0.95 μm. With the arithmetic mean roughness (Ra) of exposed surface 121 being not less than 0.15 μm, crystal grains in first contact portion 161 are sufficiently small. With the arithmetic mean roughness (Ra) of exposed surface 121 being not more than 0.95 μm, defective formation of first contact portion 161 can be suppressed.

In the present embodiment, first component 120 further includes circuit surface 122 located opposite to exposed surface 121. Exposed surface 121 is thus readily worked in first component 120. In transfer of heat generated on the side of circuit surface 122 to shield film 160 through exposed surface 121, first component 120 itself more effectively functions as a heat radiation path.

In the present embodiment, a portion of first component 120 that forms exposed surface 121 contains at least one of lithium tantalate ($LiTaO_3$), lithium niobate ($LiNbO_3$), quartz ($SiO_2$), Si, and GaAs. First component 120 itself thus more effectively functions as the heat radiation path.

In the present embodiment, shield film 160 contains at least one element selected from among Ti, Cr, Co, Ni, Fe, Cu, Ag, and Au. When shield film 160 contains such an element, performance to shield first component 120 mounted on first surface 111 is ensured, and heat radiated from exposed surface 121 is further radiated from shield film 160 to the outside.

In the present embodiment, shield film 160 includes second contact portion 162 in contact with a portion of sealing resin 150 opposite to substrate 110. Second contact portion 162 includes a layer formed of a plurality of crystal grains. The plurality of crystal grains are different in longitudinal direction from one another when they are viewed from the direction orthogonal to first surface 111. Similarly to first contact portion 161, the second contact portion can thus achieve suppression of lowering in heat radiation performance due to deformation of shield film 160.

In the present embodiment, shield film 160 extends toward the side surface of substrate 110 and comes in contact with side surface 113 of substrate 110 while the shield film covers first component 120 and sealing resin 150. A surface area of shield film 160 can thus increase and heat radiation performance of shield film 160 can be improved.

In the present embodiment, module 100 further includes internal electrode 170 which is located in the inside of substrate 110, exposed at the side surface of substrate 110, and in contact with shield film 160. Heat in substrate 110 can thus more effectively be radiated to the outside through internal electrode 170 and shield film 160.

Second Embodiment

A module according to a second embodiment of the present disclosure will be described below. The module according to the second embodiment of the present disclosure is different from module 100 according to the first embodiment of the present disclosure mainly in that a component is mounted also on a side of the second surface of the substrate. Therefore, description of the construction similar to that of module 100 according to the first embodiment of the present disclosure will not be repeated.

Figure 18:
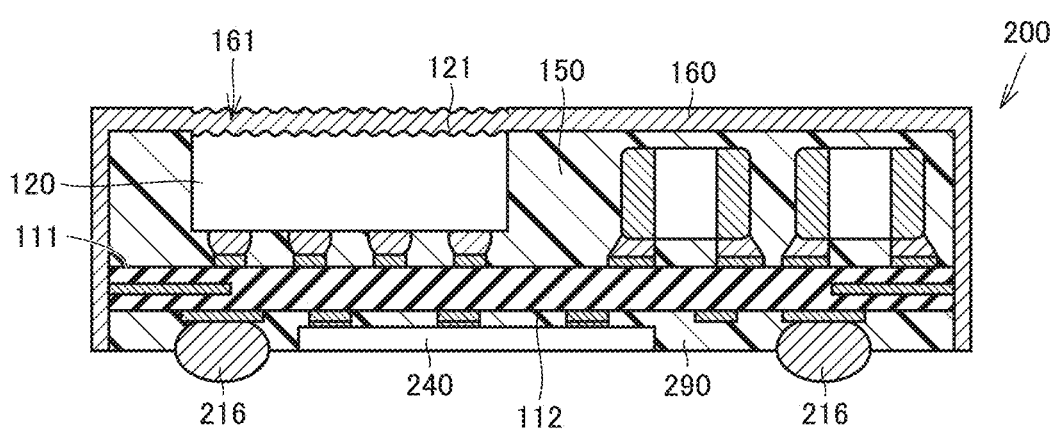
FIG. 18 is a cross-sectional view showing a module according to a second embodiment of the present disclosure.

FIG. 18 is a cross-sectional view showing the module according to the second embodiment of the present disclosure. As shown in FIG. 18, in a module 200 according to the present embodiment, a third component 240 is mounted on the side of second surface 112. Third component 240 is, for example, an IC. Separately from (first) sealing resin 150, a second sealing resin 290 is also provided on the side of second surface 112. A second external terminal 216 provided on the side of second surface 112 is exposed through second sealing resin 290. Second external terminal 216 provided on the side of second surface 112 is, for example, a solder bump.

Figure 19:
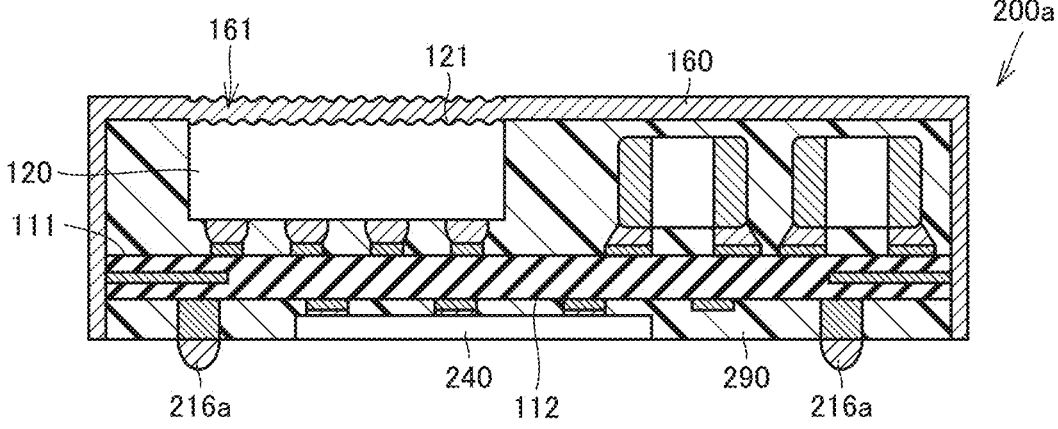
FIG. 19 is a cross-sectional view of a module according to a modification of the second embodiment of the present disclosure.

Second external terminal 216 is not limited to the construction described above. FIG. 19 is a cross-sectional view showing a module according to a modification of the second embodiment of the present disclosure. As shown in FIG. 19, in a module 200a according to the present modification, a second external terminal 216a provided on the side of second surface 112 includes a rod-shaped electrode and a solder bump. The rod-shaped electrode (I/O pin) is exposed through second sealing resin 290. The solder bump is connected onto the rod-shaped electrode exposed through second sealing resin 290.

In module 200 according to the second embodiment of the present disclosure and module 200a according to the modification thereof as well, first contact portion 161 is in contact with exposed surface 121 of first component 120 and includes a layer formed from a plurality of crystal grains. The plurality of crystal grains are different in longitudinal direction from one another when they are viewed from the direction orthogonal to first surface 111. Lowering in heat radiation performance due to deformation of shield film 160 can thus be suppressed.

Third Embodiment

A module according to a third embodiment of the present disclosure will be described below. The module according to the third embodiment of the present disclosure is different from module 100 according to the first embodiment of the present disclosure mainly in that there is a region not sealed with the sealing resin in the first surface of the substrate. Therefore, description of the construction similar to that of module 100 according to the first embodiment of the present disclosure will not be repeated.

Figure 20:
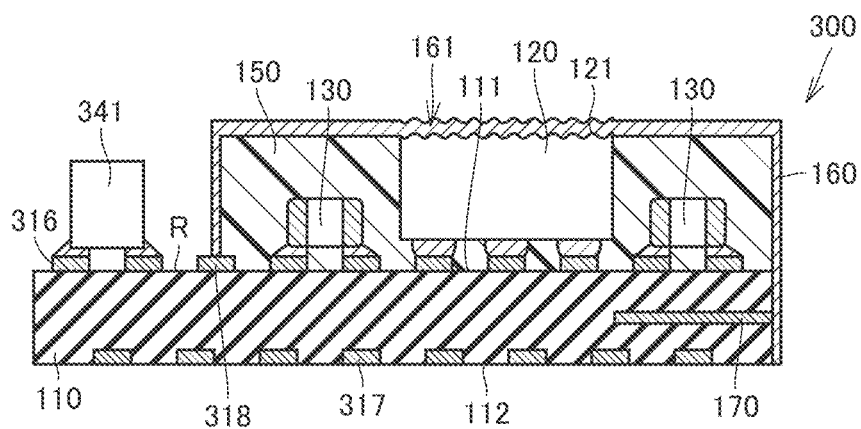
FIG. 20 is a cross-sectional view showing a module according to a third embodiment of the present disclosure.

FIG. 20 is a cross-sectional view showing the module according to the third embodiment of the present disclosure. As shown in FIG. 20, in a module 300 according to the present embodiment, in first surface 111 of substrate 110, there is a region R partially not covered with sealing resin 150. In region R, an electrode 316 is formed and a fourth component 341 is mounted with electrode 316 being interposed. Fourth component 341 is, for example, a connector.

In region R, a plurality of fourth components 341 may be mounted, or fourth component 341 may be a component other than the connector, which cannot be sealed with sealing resin 150, such as a sensor.

Substrate 110 is provided with an antenna 317. Antenna 317 may be formed on second surface 112 of substrate 110 or may be provided near second surface 112 in the inside of substrate 110. A ground electrode 318 is provided on first surface 111 of substrate 110. Ground electrode 318 is in contact with shield film 160.

In a method of manufacturing module 300 according to the third embodiment of the present disclosure, in an example where transfer molding, for example, is adopted as a method of molding sealing resin 150, region R should only be provided by molding sealing resin 150 in a mold constructed such that resin does not flow into a partial region in first surface 111 of substrate 110. In a roughening step, region R not covered with sealing resin 150 should be protected in advance so as not to be roughened. A method of protection may be, for example, a method of covering region R with a cover before the roughening step.

In module 300 according to the third embodiment of the present disclosure as well, first contact portion 161 is in contact with exposed surface 121 of first component 120 and includes a layer formed from a plurality of crystal grains. The plurality of crystal grains are different in longitudinal direction from one another when they are viewed from the direction orthogonal to first surface 111. Lowering in heat radiation performance due to deformation of shield film 160 can thus be suppressed.

Fourth Embodiment

A module according to a fourth embodiment of the present disclosure will be described below. The module according to the fourth embodiment of the present disclosure is different from the module according to the third embodiment of the present disclosure mainly in further including a shield connection member. Therefore, description of the construction similar to that of module 300 according to the third embodiment of the present disclosure will not be repeated.

Figure 21:
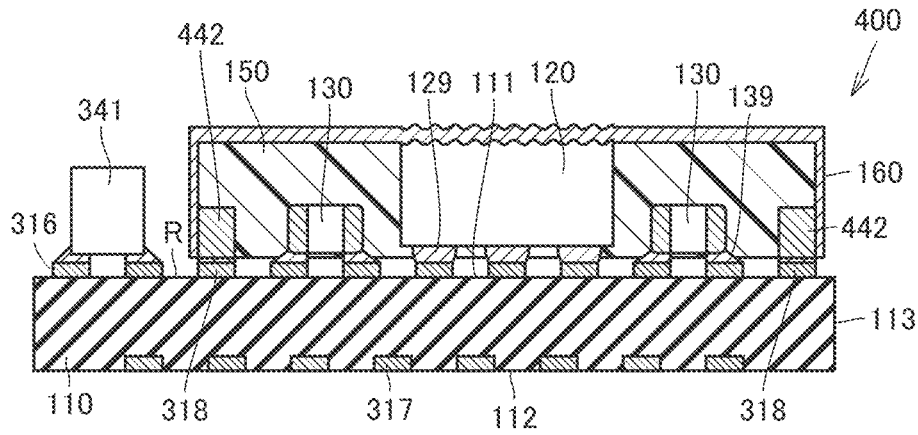
FIG. 21 is a cross-sectional view showing a module according to a fourth embodiment of the present disclosure.

FIG. 21 is a cross-sectional view showing the module according to the fourth embodiment of the present disclosure. As shown in FIG. 21, a module 400 according to the fourth embodiment of the present disclosure further includes a shield connection member 442. Shield connection member 442 is connected to ground electrode 318 provided on first surface 111 of substrate 110. Shield connection member 442 is in contact with shield film 160 on an inner side of shield film 160. Shield film 160 is thus electrically connected to ground electrode 318 with shield connection member 442 being interposed.

In module 400 according to the fourth embodiment of the present disclosure, a bonding portion (corresponding to solder bump 129) of first component 120 and a bonding portion (corresponding to solder 139) of second component 130 are exposed at a lower surface of sealing resin 150. Shield film 160 is not in contact with side surface 113.

Figure 22:
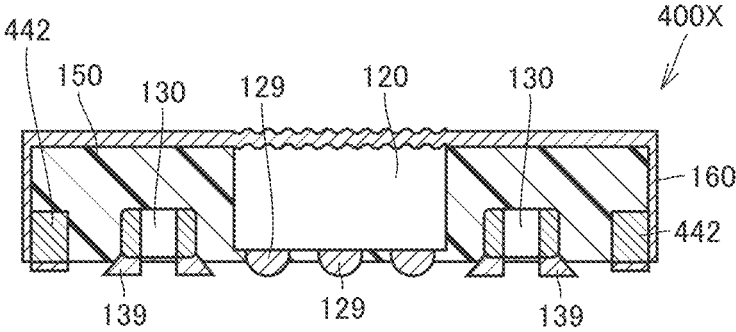
FIG. 22 is a cross-sectional view showing an exemplary assembly used in manufacturing of the module according to the fourth embodiment of the present disclosure.

Module 400 according to the fourth embodiment of the present disclosure shown in FIG. 21 can be manufactured, for example, by mounting an assembly which will be described below and fourth component 341 on substrate 110. FIG. 22 is a cross-sectional view showing an exemplary assembly used in manufacturing of the module according to the fourth embodiment of the present disclosure. Module 400 according to the fourth embodiment of the present disclosure can be manufactured by mounting an assembly 400X shown in FIG. 22 on first surface 111 of substrate 110 together with fourth component 341 (see FIG. 21). In FIG. 22, a corresponding element of module 400 in assembly 400X has the same reference character allotted.

Assembly 400X does not include wiring that electrically connects first component 120 and second component 130 to each other. The wiring that connects first component 120 and second component 130 to each other is provided in substrate 110 on which assembly 400X is mounted. Components of assembly 400X are electrically connected to one another by mounting assembly 400X on substrate 110. Assembly 400X can be manufactured by the manufacturing method similar to the method of manufacturing module 100 according to the first embodiment of the present disclosure except for providing assembly 400X on a temporary carrier instead of the substrate. In other words, assembly 400X is provided on the temporary carrier and thereafter the temporary carrier is removed from assembly 400X, to thereby manufacture assembly 400X.

Features that can be combined in the description of the embodiments above may be combined with each other.

It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

100, 200, 200a, 300, 400, 900 module; 110 substrate; 110a substrate assembly; 111 first surface; 112 second surface; 113 side surface; 115 external terminal; 116 internal terminal; 120, 920 first component; 121 exposed surface; 122 circuit surface; 123 peripheral side surface; 129 solder bump; 130 second component; 139 solder; 150 sealing resin; 150F filler; 150R resin component; 151 chipped portion; 152 depression; 160, 960 shield film; 161 first contact portion; 162 second contact portion; 170 internal electrode; 216, 216a second external terminal; 240 third component; 290 second sealing resin; 316 electrode; 317 antenna; 318 ground electrode; 341 fourth component; 400X assembly; 442 shield connection member; 1000 grinding machine; 2000 injection nozzle; GM1, GM2, GO1, GO2 crystal grain; LI1 first inner layer; LI2 second inner layer; LM1 first intermediate layer; LM2 second intermediate layer; LO1 first outer layer; LO2 second outer layer

The invention claimed is:

1. A module comprising:
a substrate having a first surface;
a first component mounted on the first surface;
a sealing resin sealing the first component at least from a lateral side; and
a shield film comprising metal, the shield film covering the first component and the sealing resin, wherein
the first component has an exposed surface exposed through the sealing resin on a side opposite to the substrate,
the shield film has a first contact portion in contact with the exposed surface, and
the first contact portion includes a layer comprising a plurality of crystal grains, and the plurality of crystal grains are different in a longitudinal direction from one another when the plurality of crystal grains are viewed from a direction orthogonal to the first surface.

2. The module according to claim 1, wherein
the exposed surface is roughened.

3. The module according to claim 2, wherein
the exposed surface has arithmetic mean roughness (Ra) not less than 0.15 μm and not more than 0.95 μm.

4. The module according to claim 3, wherein
the first component further has a circuit surface located opposite to the exposed surface.

5. The module according to claim 3 wherein
a portion of the first component forming the exposed surface contains at least one of lithium tantalate (LiTaO$_3$), lithium niobate (LiNbO$_3$), quartz (SiO$_2$), Si, and GaAs.

6. The module according to claim 3, wherein
the shield film contains at least one element selected from among Ti, Cr, Co, Ni, Fe, Cu, Ag, and Au.

7. The module according to claim 2, wherein
the first component further has a circuit surface located opposite to the exposed surface.

8. The module according to claim 2, wherein
a portion of the first component forming the exposed surface contains at least one of lithium tantalate (LiTaO$_3$), lithium niobate (LiNbO$_3$), quartz (SiO$_2$), Si, and GaAs.

9. The module according to claim 2, wherein
the shield film contains at least one element selected from among Ti, Cr, Co, Ni, Fe, Cu, Ag, and Au.

10. The module according to claim 2, wherein
the shield film has a second contact portion in contact with a portion of the sealing resin opposite to the substrate, and
the second contact portion includes a layer comprising a plurality of crystal grains, and the plurality of crystal grains are different in the longitudinal direction from one another when the plurality of crystal grains are viewed from the direction orthogonal to the first surface.

11. The module according to claim 1, wherein
the first component further has a circuit surface located opposite to the exposed surface.

12. The module according to claim 11, wherein
a portion of the first component forming the exposed surface contains at least one of lithium tantalate (LiTaO$_3$), lithium niobate (LiNbO$_3$), quartz (SiO$_2$), Si, and GaAs.

13. The module according to claim 11, wherein
the shield film contains at least one element selected from among Ti, Cr, Co, Ni, Fe, Cu, Ag, and Au.

14. The module according to claim 1, wherein
a portion of the first component forming the exposed surface contains at least one of lithium tantalate (LiTaO$_3$), lithium niobate (LiNbO$_3$), quartz (SiO$_2$), Si, and GaAs.

15. The module according to claim 14, wherein
the shield film contains at least one element selected from among Ti, Cr, Co, Ni, Fe, Cu, Ag, and Au.

16. The module according to claim 1, wherein
the shield film contains at least one element selected from among Ti, Cr, Co, Ni, Fe, Cu, Ag, and Au.

17. The module according to claim 1, wherein
the shield film has a second contact portion in contact with a portion of the sealing resin opposite to the substrate, and
the second contact portion includes a layer comprising a plurality of crystal grains, and the plurality of crystal grains are different in the longitudinal direction from one another when the plurality of crystal grains are viewed from the direction orthogonal to the first surface.

18. The module according to claim 1, wherein
the shield film extends toward a side surface of the
    substrate and comes in contact with the side surface of
    the substrate while the shield film covers the first
    component and the sealing resin.

19. The module according to claim 18, further comprising
an internal electrode located in inside of the substrate,
exposed at the side surface of the substrate, and being in
contact with the shield film.

* * * * *